United States Patent
Bell et al.

(10) Patent No.: US 6,627,360 B1
(45) Date of Patent: Sep. 30, 2003

(54) CARBONIZATION PROCESS FOR AN ETCH MASK

(75) Inventors: Scott A. Bell, San Jose, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 154 days.

(21) Appl. No.: 09/900,985

(22) Filed: Jul. 9, 2001

(51) Int. Cl.⁷ .............................. G03F 9/00; G03C 5/00
(52) U.S. Cl. .......................... 430/5; 430/311; 430/313; 430/314; 430/329
(58) Field of Search ............................ 430/5, 311, 313, 430/314, 329

(56) References Cited

U.S. PATENT DOCUMENTS 6,337,163 B1 * 1/2002 Sato ........................... 430/30

* cited by examiner

*Primary Examiner*—Christopher G. Young
(74) *Attorney, Agent, or Firm*—Foley & Lardner

(57) ABSTRACT

A method of forming an etch mask includes patterning a top surface of a photoresist layer, carbonizing the patterned top surface of the photoresist layer and selectively removing portions of the photoresist layer. Portions of the photoresist layer under the carbonized areas remain. A substrate or a layer above substrate can be etched or processed in accordance with the mask formed from the photoresist layer.

20 Claims, 6 Drawing Sheets

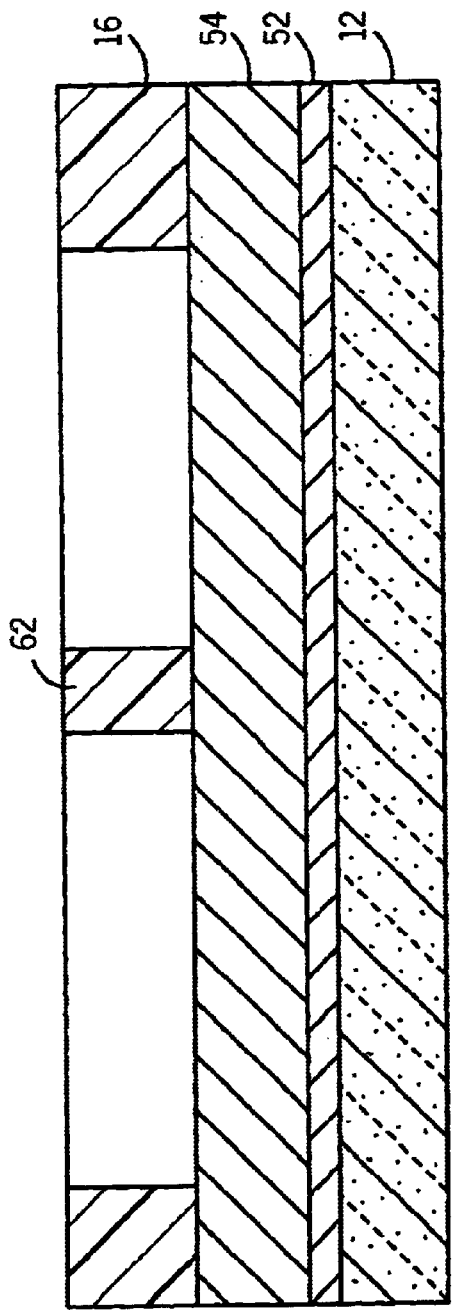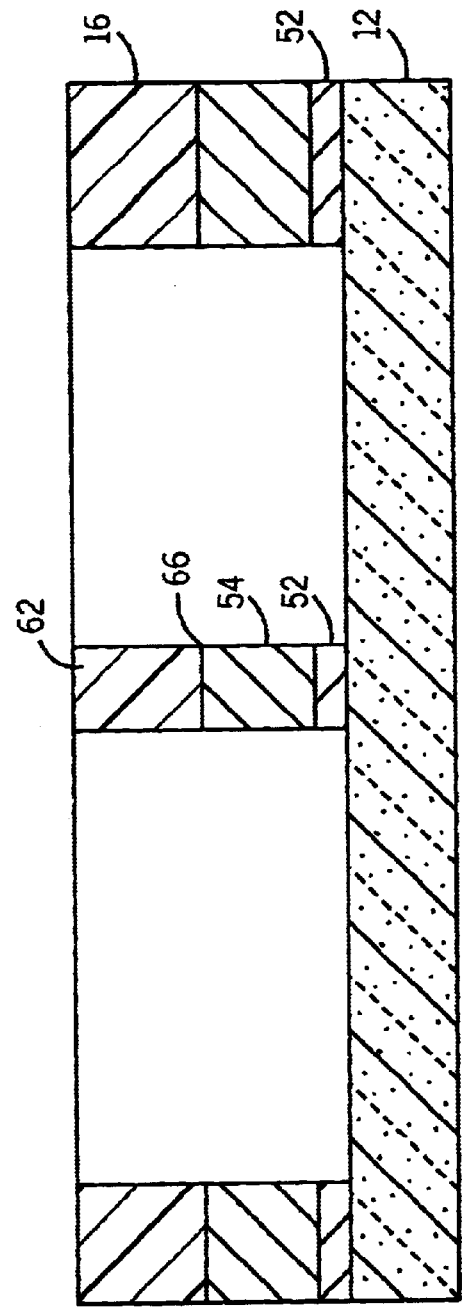

CARBONIZATION PROCESS FOR AN ETCH MASK

FIELD OF THE INVENTION

The present specification relates to the fabrication of integrated circuits (ICs). More specifically, the present specification relates to a patterning process for forming small integrated circuit features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultraviolet light. The radiation can also be x-ray radiation, e-beam radiation, etc.

The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the lithographic coating through a photomask or reticle causes the image area to become selectively crosslinked and consequently either more or less soluble (depending on the coating) in a particular solvent developer. The more soluble (i.e., uncrosslinked) or unprotected areas are removed in the developing process to leave the pattern image in the coating as less soluble polymer.

The photoresist material or layer associated with conventional lithographic technologies is often utilized to selectively form various IC structures, regions, and layers. Generally, the patterned photoresist material can be utilized to define doping regions, implant regions or other structures associated with an integrated circuit (IC). For example, a conventional lithographic system is generally utilized to pattern photoresist material to form gate stacks and other structures. Heretofore, patterning resolution and accuracy have been limited to the dimensions associated with conventional lithography.

Thus, there is a need to pattern IC devices using non-conventional lithographic techniques. Further, there is a need for a process of patterning photoresist material that can achieve smaller dimensions. Yet further, there is a need for a hybrid top surface imaging/isotropic etch process. Even further still, there is a need for gate stacks having smaller widths (smaller gate lengths for the transistor).

SUMMARY OF THE INVENTION

An exemplary embodiment relates to a method of fabricating an integrated circuit on a substrate. The method includes providing a photoresist layer above the substrate, patterning the photoresist layer to form a first feature and carbonizing the photoresist layer. The method further includes isotropically etching the photoresist layer and removing the carbonized portion of the photoresist layer to leave a second feature having a width smaller than the first feature.

Another exemplary embodiment relates to a method of fabricating an etch mask for an integrated circuit. The method includes providing a resist layer directly over the layer or substrate to be etched, patterning the resist layer to form a first feature, carbonizing the resist layer to form a carbonized region in the resist layer, and removing portions of the resist layer. The portions of the resist layer are disposed underneath the carbonized region. Removing portions of the resist layer under the carbonized region forms a second feature below the carbonized region. The second feature has a width smaller than the first feature.

Yet another exemplary embodiment relates to a method of forming a gate conductor for an integrated circuit. The method includes steps of providing a photoresist layer above a gate conductor, patterning the photoresist layer to form a first feature, carbonizing a top surface of the photoresist layer, and selectively removing the photoresist layer. The photoresist layer is selectively removed to form a second feature smaller than the first feature. The method also includes etching the gate conductor layer in accordance with the second feature.

BRIEF DESCRIPTION OF THE DRAWINGS

The exemplary embodiments will hereafter be described with reference to the accompanying drawings, wherein like numerals denote like elements, and:

FIG. 7 is a schematic cross-sectional view of the substrate illustrated in FIG. 6, showing a gate conductor etching step in accordance with an exemplary embodiment;

FIG. 8 is a schematic cross-sectional view of the substrate illustrated in FIG. 7, showing a gate dielectric etching step in accordance with an exemplary embodiment.

DETAILED DESCRIPTION OF THE PREFERRED EMBODIMENTS

Figure 1:
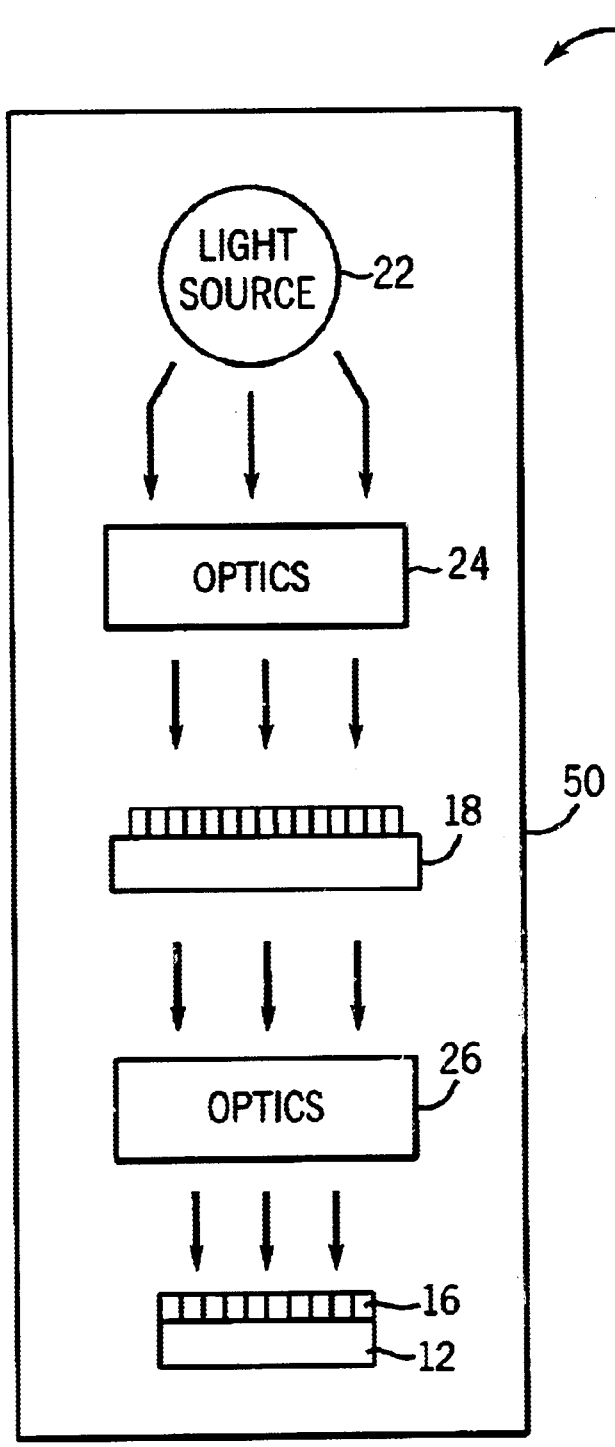
FIG. 1 is a general schematic block diagram of a lithographic system for processing a substrate according to an exemplary embodiment.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Lithographic system 10 provides a pattern of radiation to substrate 12. System 10 can include a chamber 50. Chamber 50 can be a vacuum or low pressure chamber for use in UV, deep UV, or VUV lithography. Chamber 50 can contain any of numerous types atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, and an objective lens assembly 26. System 10 can include a stage that supports substrate 12 and can move substrate 12 with respect to lens assembly 26. System 10 can have a variety of configurations and arrangements. The configuration of system 10 shown in FIG. 1 is exemplary.

System 10 can include mirrors, beam splitters, and other components arranged according to other designs. System 10 can be embodied as a lithographic camera or stepper unit. An example of lithographic system 10 is a PAS5500/xxx series machine manufactured by ASML. Other examples include Microscan DUV systems by Silicon Valley Group or an XLS family Microlithography System by Integrated Solutions, Inc. of Korea.

Substrate 12 can include one or more layers of material thereon. The layers can be insulative layers, conductive layers, barrier layers, or other layer of material which is to be etched, or selectively removed using the process described herein.

In one embodiment, the layers above substrate 12 are a dielectric layer and a gate conductor layer used to form a gate stack. The dielectric layer can be a gate oxide and the gate conductor layer can be polysilicon or metal. The gate stack is configured using the process described below. Various integrated circuit features may be fabricated using the method described below.

Substrate 12 and subsequent layers of material are not described in a limiting fashion. The principles of the present invention can be applied to any integrated circuit substrate, wafer, mask layer, or other layer. Substrate 12 can be conductive, semiconductive, or insulative.

A layer of lithographic material, such as, a photoresist layer or material 16 is deposited or applied over substrate 12. Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a low-contrast photoresist, but may alternatively be a high-contrast photoresist.

Photoresist material 16 is deposited by, for example, spin-coating over material such as substrate 12. Preferably, photoresist material 16 has a thickness between 0.5 and 0.05 microns. Further, photoresist material 16 may be either a positive photoresist or a negative photoresist and can be an organic or non-organic photoresist material.

Photoresist material 16 can be a bi-layer photoresist. Alternatively, a monolayer photoresist having the appropriate characteristics can be utilized. In one embodiment, material 16 can be a commercial photoresist material such as a phenolic polymer photoresist comprising a chemically amplified type photoresist manufactured by Shipley TOK Clarent or an acrylic polymer. Material 16 is preferably capable of being carbonized when exposed to an e-beam or an ion implant.

With reference to FIGS. 1–8, an exemplary process for forming an etch mask is described below as follows. The process advantageously reduces the width associated with a feature, such as a gate length.

Figure 2:
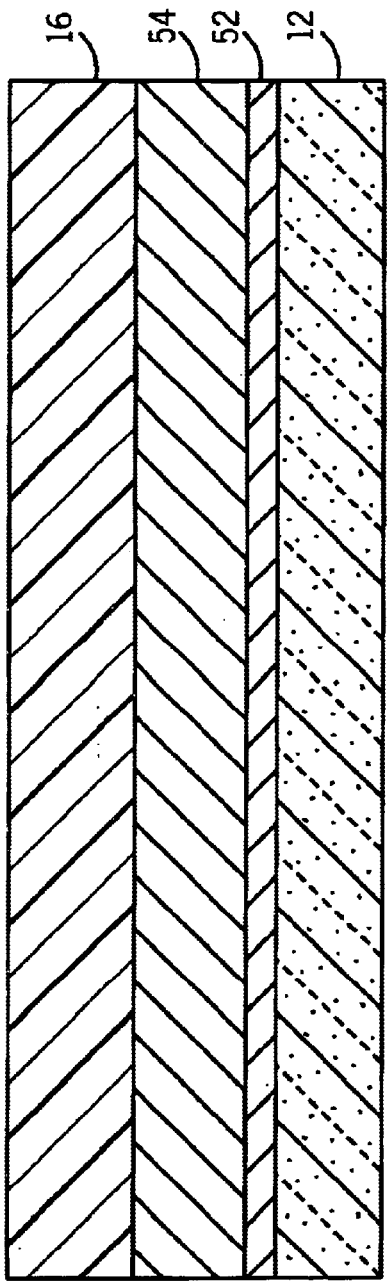
FIG. 2 is a schematic cross-sectional view of the substrate illustrated in FIG. 1, showing a photoresist layer application step in accordance with an exemplary embodiment.

With reference to FIG. 2, substrate 12 includes a dielectric layer 52 and a gate conductor layer 54. Layers 52 and 54 are a conductive/dielectric stack for the formation of a gate structure. Layers 52 and 54 can have a variety of thicknesses and be manufactured from a variety of materials. In one embodiment, gate conductor layer 54 is a 1000–2000 Å thick polysilicon layer and layer 52 is a 5–20 Å thick silicon dioxide or silicon nitride layer. Layer 54 can be deposited by chemical vapor deposition (CVD) above layer 52. Layer 52 can be grown or deposited (CVD) above substrate 12.

An anti-reflective coating layer can be provided above layer 54 and underneath material 16. Material 16 can be applied by spin coating to a thickness of 1000–6000 Å. Material 16 is preferably a positive type photoresist.

Figure 3:
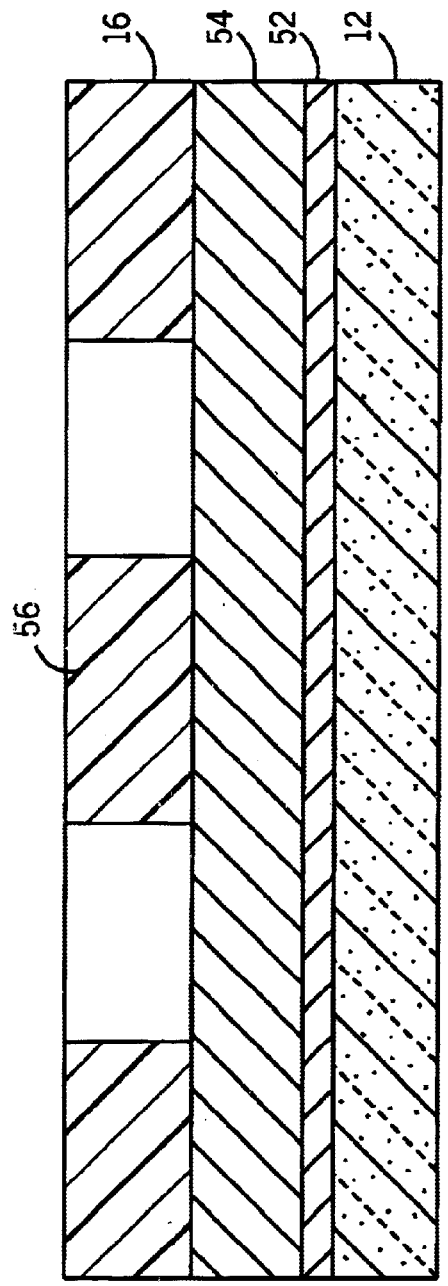
FIG. 3 is a schematic cross-sectional view of the substrate illustrated in FIG. 2, showing a photoresist patterning step in accordance with an exemplary embodiment.

With reference to FIG. 3, photoresist material 16 is configured to have a feature 56 according to a conventional lithographic process in a system, such as, system 10. Material 16 can be selectively etched to leave feature 56. Feature 56 can define a gate length for a gate stack.

In one embodiment, reticle 18 (FIG. 1) is utilized to pattern feature 56 in material 16. After exposure to radiation in system 10, material 16 is developed to leave feature 56. Feature 16 can represent a minimum lithographic feature size. In one embodiment, feature 16 is 100 nm wide and is used to form a gate conductor.

Figure 4:
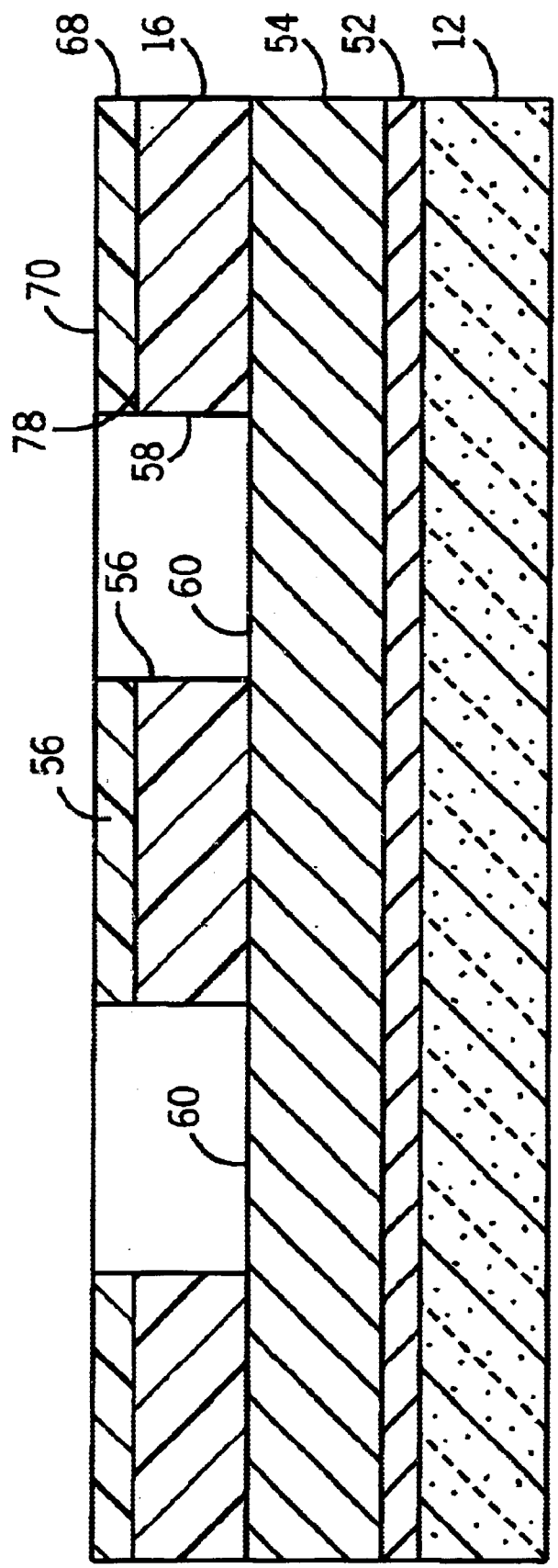
FIG. 4 is a schematic cross-sectional view of the substrate illustrated in FIG. 3, showing a carbonizing step in accordance with an exemplary embodiment.

With reference to FIG. 4, layer 16 is subjected to a carbonization process to form carbonized regions or portions 68. Preferably, the carbonization process leaves uncarbonized portions 58 of photoresist material 16. Gate conductor layer 54 can be affected by the carbonization process due to the absence of material 16 at apertures 60. However, subsequent etching removes these portions of gate conductor layer 54.

Carbonized portions 68 preferably extends from a top surface 70 to a top surface 78 of uncarbonized portions 58 of material 16. In one embodiment, the thickness of carbonized portion 68 is 250–750 Å (preferably 500 Å) (e.g., from surface 70 to surface 78). In another embodiment, the thickness of portion 68 is 10–75 percent of the total thickness of material 16. Preferably, the thickness of carbonized portion 68 ranges from 100 to 1000 Å.

Carbonized portions 68 can be formed according to an e-beam exposure or an ion implantation technique. The implantation technique or e-beam exposure carbonizes material 16 as it cross links the photoresist. Portion 68 becomes harder due to the carbonization process. A variety of species can be utilized for implantation or e-beam exposure to form portions 68.

In one embodiment, xenon can be utilized. For example, xenon can be energized to 85 KeV and provided at a dose of 1E15 ions/square centimeter to substrate 12 to form portions 68. The depth of portions 68 can be adjusted by adjusting implant energy associated with the carbonization process.

Figure 5:
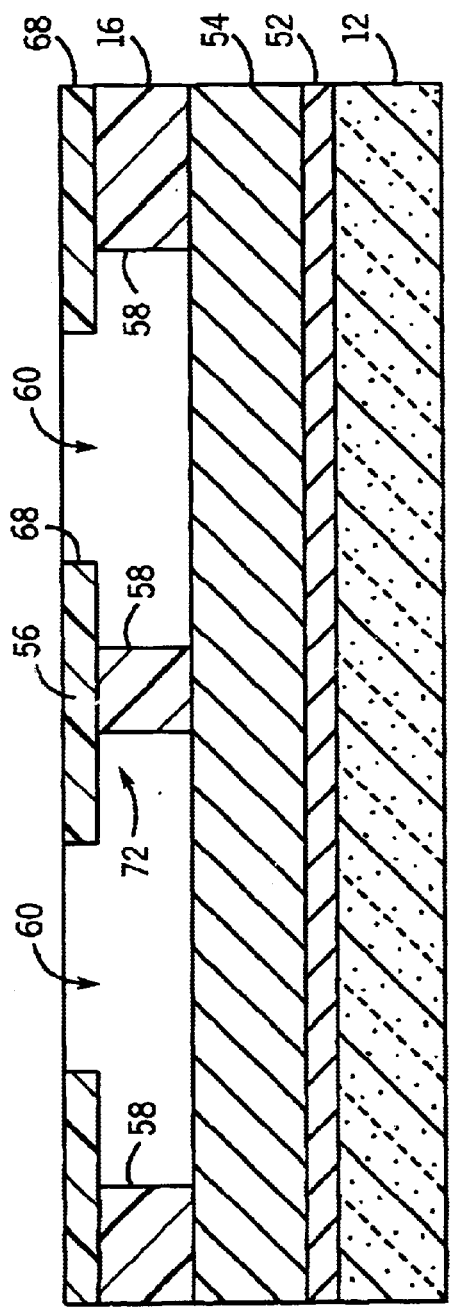
FIG. 5 is a schematic cross-sectional view of the substrate illustrated in FIG. 4, showing an etching step in accordance with an exemplary embodiment.

With reference to FIG. 5, after portions 68 are formed, substrate 12 is subject to a trim etching process. According to one embodiment, an isotropic etch is performed to shrink the width of uncarbonized portions 58 of layer 16. For example, an $O_2$ plasma etch can be utilized to reduce the thickness of uncarbonized portions 58 of material 16. Portions of layer 54 in aperture 60 can be affected by the $O_2$ etch. However, these portions of layer 54 are removed in subsequent etching. Various design criteria and system parameters can be utilized to control the width of portions 58. For example, the depth of portions 68 and the length of the isotropic etch can be adjusted to control the width. of portions 58. Preferably, the etch rate of portions 58 is faster than the etch rate of portions 68 due to the carbonization process. Accordingly, undercut 72 is formed beneath portions 68.

The $O_2$ plasma etch can utilize an Applied Materials DPS Polyetch tool. The tool can use a pressure of 3–30 mt a source power, 200–1000W and a bias power 0–100W. The gas flow rates can be as follows: $O_2$: 5–50 sccm; AR: 0–100 sccm;; HBr: 0–100 sccm.

Figure 6:
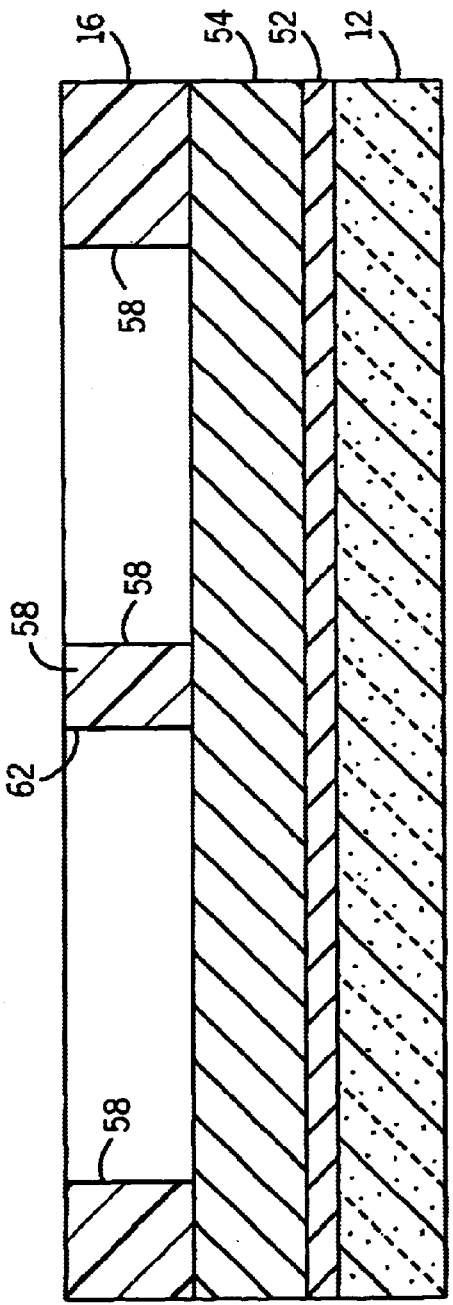
FIG. 6 is a schematic cross-sectional view of the substrate illustrated in FIG. 5, showing a removal step in accordance with an exemplary embodiment.

With reference to FIG. 6, portions 68 (FIG. 5) are removed from above portions 58 of material 16. Accordingly, a feature 62 is formed having a smaller width than feature 56. In one embodiment, the width of feature 56 is 100 nm and the width is feature 62 is 50 nm. According to another embodiment, the width of feature 62 is 20 percent of the width of feature 56. According to another embodiment, the width of feature 62 can range from 10 to 70 nm.

With reference to FIG. 7, after feature 62 is formed in material 16, layer 54 is etched. Preferably, layer 54 is etched in a dry etching process such as a polysilicon etching process.

With reference to FIG. 8, dielectric layer 52 is etched in accordance with feature 62. In one embodiment, layer 52 is etched in a dry etching process to form a gate stack 66. Material 16 can be removed before or after layer 52 is etched.

Figure 9:
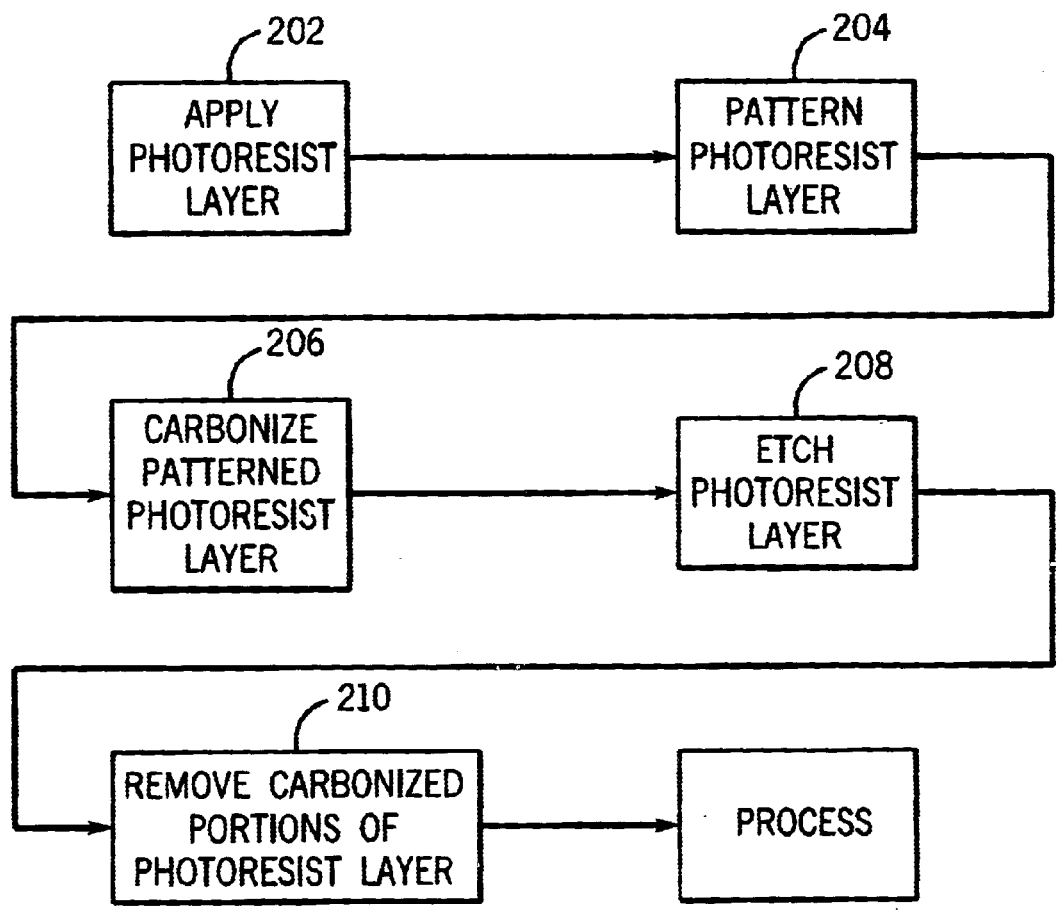
FIG. 9 is flow diagram showing a carbonization process for etching a substrate or a layer above a substrate.

With reference to FIG. 9, flow diagram 200 describes a process for forming an etch mask. At a step 202, photoresist, such as photoresist material 16 is applied above substrate 12. At a step 204, photoresist material 16 is patterned in a lithographic system 10. The photoresist is patterned so that a top surface includes a feature 56 (FIG. 3).

At a step 206, material 16 is carbonized to transform feature 56 into carbonized portions 68 (FIG. 4). At a step 208, material 16 is etched in accordance with the carbonized portions 68 to form feature 62 (FIG. 6). At a step 210, substrate 12 is processed in accordance with feature 62. Processing can include providing etching substrate 12 or a layer above substrate 12.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of photoresist material and carbonization processes are mentioned, other materials and process steps can be utilized. Various changes may be made to the details disclosed without departing from the spirit of the invention which is defined by the following claims.

What is claimed is:

1. A method of fabricating integrated circuit on a substrate, the method comprising:

providing a photoresist layer above the substrate;

patterning the photoresist layer to form a first feature;

carbonizing the photoresist layer after the first feature is patterned;

isotropically etching the photoresist layer; and removing carbonized portions of the photoresist layer to leave a second feature having a width smaller than the first feature.

2. The method of claim 1, further comprising:

etching a polysilicon layer above the substrate in accordance with the second feature.

3. The method of claim 2, further comprising stripping the photoresist layer before the etching step.

4. The method of claim 3, wherein the carbonizing step utilizes an e-beam exposure.

5. The method of claim 3, wherein the carbonizing step utilizes an implant.

6. The method of claim 5, wherein the implant is a vertical implant.

7. The method of claim 5, wherein the photoresist layer includes phenolic polymer.

8. The method of claim 6, wherein the removing step is an anisotropic etching step.

9. The method of claim 1, wherein the photoresist is cross-linked during the carbonizing step.

10. A method of fabricating an etch mask for an integrated circuit, the method comprising:

providing a resist layer directly over a layer or a substrate, the layer or the substrate to be etched;

patterning the resist layer to form a first feature;

carbonizing the resist layer to form a carbonized region in the resist layer after patterning; and removing portions of the resist layer underneath the carbonized region to form a second feature below the carbonized region, the second feature having a smaller width than the first feature.

11. The method of claim 10, further comprising removing the carbonized region.

12. The method of claim 11, wherein the carbonized region is formed by an ion implant.

13. The method of claim 12, wherein the ion implant includes xenon.

14. The method of claim 13, wherein the carbonized region extends to a depth of 500 Å below a top surface.

15. The method of claim 13, wherein the photoresist material is all organic photoresist.

16. A method of forming a gate conductor for an integrated circuit, the method comprising steps of:

providing a photoresist layer above a gate conductor;

patterning the photoresist layer to form a first feature;

carbonizing a top surface of the photoresist layer after the patterning step;

selectively removing the photoresist layer to form a second feature smaller than the first feature; and etching the gate conductor layer in accordance with the second feature.

17. The method of claim 16, wherein the photoresist layer has a thickness of 0.5 to 0.05 microns.

18. The method of claim 16, wherein the carbonizing step forms a carbonized region having a thickness between 250 and 750 microns.

19. The method of claim 18, wherein the carbonized region has a thickness of 500 microns.

20. The method of claim 16, wherein the photoresist layer comprises an organic layer.

* * * * *

UNITED STATES PATENT AND TRADEMARK OFFICE
CERTIFICATE OF CORRECTION

PATENT NO.     : 6,627,360 B1
DATED          : September 30, 2003
INVENTOR(S)    : Scott A. Bell and Christopher F. Lyons It is certified that error appears in the above-identified patent and that said Letters Patent is hereby corrected as shown below:

<u>Column 5,</u>
Line 1, please insert -- an -- before "integrated circuit".

<u>Column 6,</u>
Line 45, please replace "all" with -- an --.

Signed and Sealed this

Twenty-seventh Day of April, 2004

JON W. DUDAS
*Acting Director of the United States Patent and Trademark Office*